(12) United States Patent
Gez

(10) Patent No.: US 8,362,801 B1
(45) Date of Patent: Jan. 29, 2013

(54) METHOD OF PROGRAMMING A SAFETY COMPONENT

(75) Inventor: Arie Gez, Netanyya (IL)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 13/279,371

(22) Filed: Oct. 24, 2011

(51) Int. Cl.
*H03K 19/173* (2006.01)

(52) U.S. Cl. .......................... 326/38; 326/16; 326/47

(58) Field of Classification Search ............... 326/9–10, 326/14, 16, 37–41, 46–47, 101
See application file for complete search history.

(56) References Cited

U.S. PATENT DOCUMENTS

| 6,148,390 | A  | * | 11/2000 | MacArthur et al. | ............ 712/37 |
| 6,714,044 | B1 | * | 3/2004  | Rangan et al.    | ............ 326/40 |
| 7,397,274 | B1 | * | 7/2008  | Tang et al.      | ............ 326/40 |

* cited by examiner

*Primary Examiner* — James H Cho
(74) *Attorney, Agent, or Firm* — Nelson Adrian Blish

(57) ABSTRACT

A method for a singular programming a programmable component in an electronic circuit includes providing a plurality of programmable components connected between each other in an electronic chain arrangement; providing an interface adapted to connect the programmable components to an external controller wherein the controller is adapted to program the programmable components; isolating and programming a safety component by setting an output pin in the safety component to logical state zero at first power up of the electronic circuit and logical state zero causes input and output data lines from the interface to be connected just to the safety component; and setting the output pin in the safety component to logical state one wherein the logical state one causes input and output data lines from the interface to disconnect from the safety component and connect to the electronic chain of the plurality of programmable components excluding the safety component.

3 Claims, 3 Drawing Sheets

METHOD OF PROGRAMMING A SAFETY COMPONENT

CROSS REFERENCE TO RELATED APPLICATIONS

Reference is made to commonly-assigned U.S. patent application Ser. No. 13/279,370, filed Oct. 24, 2011, entitled SAFETY COMPONENT IN A PROGRAMMABLE COMPONENTS CHAIN, by Gez; the disclosure of which is incorporated herein.

FIELD OF THE INVENTION

This invention relates in general to programming a complex programmable logic device (CPLD) and in particular to programming a safety electronic circuit.

BACKGROUND OF THE INVENTION

Computer-to-plate (CTP) imaging devices use laser diodes for imaging on a substrate. Leakage of laser light from the imaging device during imaging operation may be hazardous to people in proximity to the device. Various safety measures may be required as high power invisible laser (IR) beams are present at least in the optical fibers of the device during operation and could cause eye damage if they leaked from the device. Interlock sensors are deployed in the device at various locations to notify of hazardous situations or to prevent, for example, opening the device door during operation. The sensors are integrated with specific electronic circuitry as shown in FIG. 1. When one or more of the interlock and safety sensors goes off, indicating a potential leak of laser light, the laser sources are disabled and fault warning activated.

Safety devices are mandatory in potentially hazardous products, and are required to be installed by international safety standards. Safety measures in devices can be incorporated by various means such as software, electronic CPLD components or electro-mechanical components. In the case of CPLD components, the CPLD components are installed on an circuit board, which may include more than one CPLD component. One of the CPLD components may be used for safety.

CPLD components are programmable and the programming is done via a joint test action group (JTAG) port residing on the electronic board and connected typically to a personal computer by an appropriate cable. The CPLD reprogramming may be done by service engineers in the field, therefore it is essential to prevent reprogramming of the CPLD components related to safety and make sure they are programmed only at the manufacturing site. Reprogramming of CPLDs which are intended for safety control in the field is dangerous since it may hinder safe operation of the product, and thus may cause irreversible harm to the product operators, during product operation.

FIG. 1 shows several CPLD components (124, 128, 132) residing on electronic board 100. The JTAG interface is connected to each of the CPLD components by input and output pins (TDI, TDO) and timing and clock pins (TMS, TCK). The signals TDI, TDO, TMS and TCK are used for accessing and programming of the CPLDs residing on electronic board 100. The CPLD components are concatenated between each other via the input and output pins (TDI, TDO). The TDI signal from JTAG interface 108 is connected to first CPLD 124 via its TDI line. The output line TDO of CPLD 124 is further connected to the input line TDI of the next CPLD in the chain 128. The output pin TDO of the last CPLD in the chain 132 is connected to the TDO line of JTAG interface 108 to form a complete chain of the CPLDs on electronic board 100. The timing TMS and clock pin TCK are connected in parallel from JTAG interface 108 to all CPLDs (124, 128, 132) and controlled by timing and clock pins (TMS, TCK).

The programming of the CPLD components is performed by an external controller 104. The programming data is delivered to JTAG interface 108 via interface lines 112. The content of each of the CPLD components (124, 128, 132) can be independently programmed by controller 104. CPLD 124, which is selected to serve safety measures, has to be treated with more caution than other CPLDs, therefore programming of CPLD 124 should be permitted only once and at the manufacturing site only. Programming at a customer site is unacceptable.

SUMMARY OF THE INVENTION

Briefly, according to one aspect of the present invention a method for a singular programming a programmable component in an electronic circuit includes providing a plurality of programmable components connected between each other in an electronic chain arrangement; providing an interface adapted to connect the programmable components to an external controller wherein the controller is adapted to program the programmable components; isolating and programming a safety component by setting an output pin in the safety component to logical state zero at first power up of the electronic circuit and logical state zero causes input and output data lines from the interface to be connected just to the safety component; and setting the output pin in the safety component to logical state one wherein the logical state one causes input and output data lines from the interface to disconnect from the safety component and connect to the electronic chain of the plurality of programmable components excluding the safety component.

The invention and its objects and advantages will become more apparent in the detailed description of the preferred embodiment presented below.

DETAILED DESCRIPTION OF THE INVENTION

In the following detailed description, numerous specific details are set forth in order to provide a thorough understanding of the disclosure. However, it will be understood by those skilled in the art that the teachings of the present disclosure may be practiced without these specific details. In other instances, well-known methods, procedures, components and circuits have not been described in detail so as not to obscure the teachings of the present disclosure.

Figure 1:
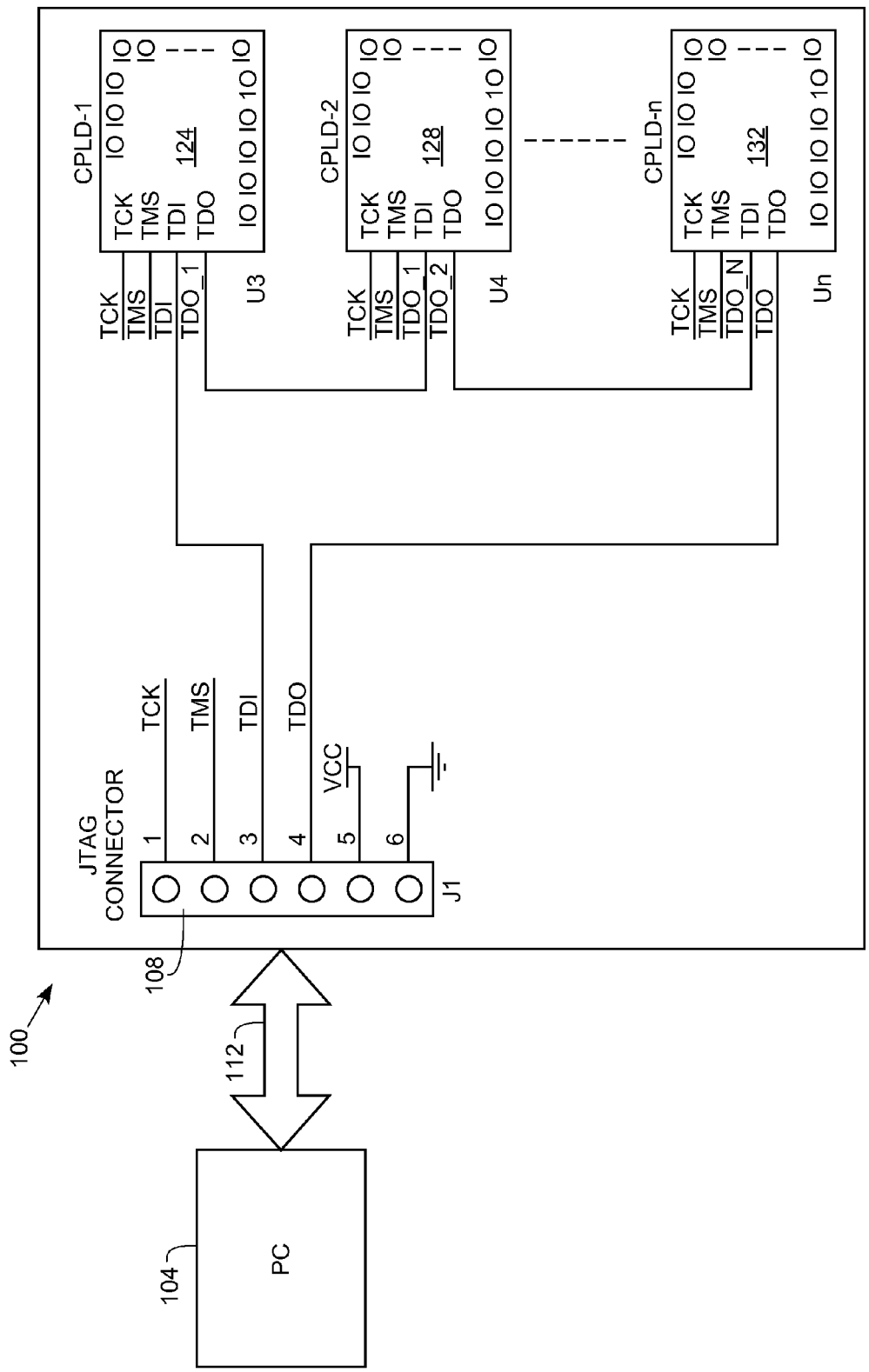
FIG. 1 is a prior art schematic showing several concatenated CPLD components.
Figure 2:
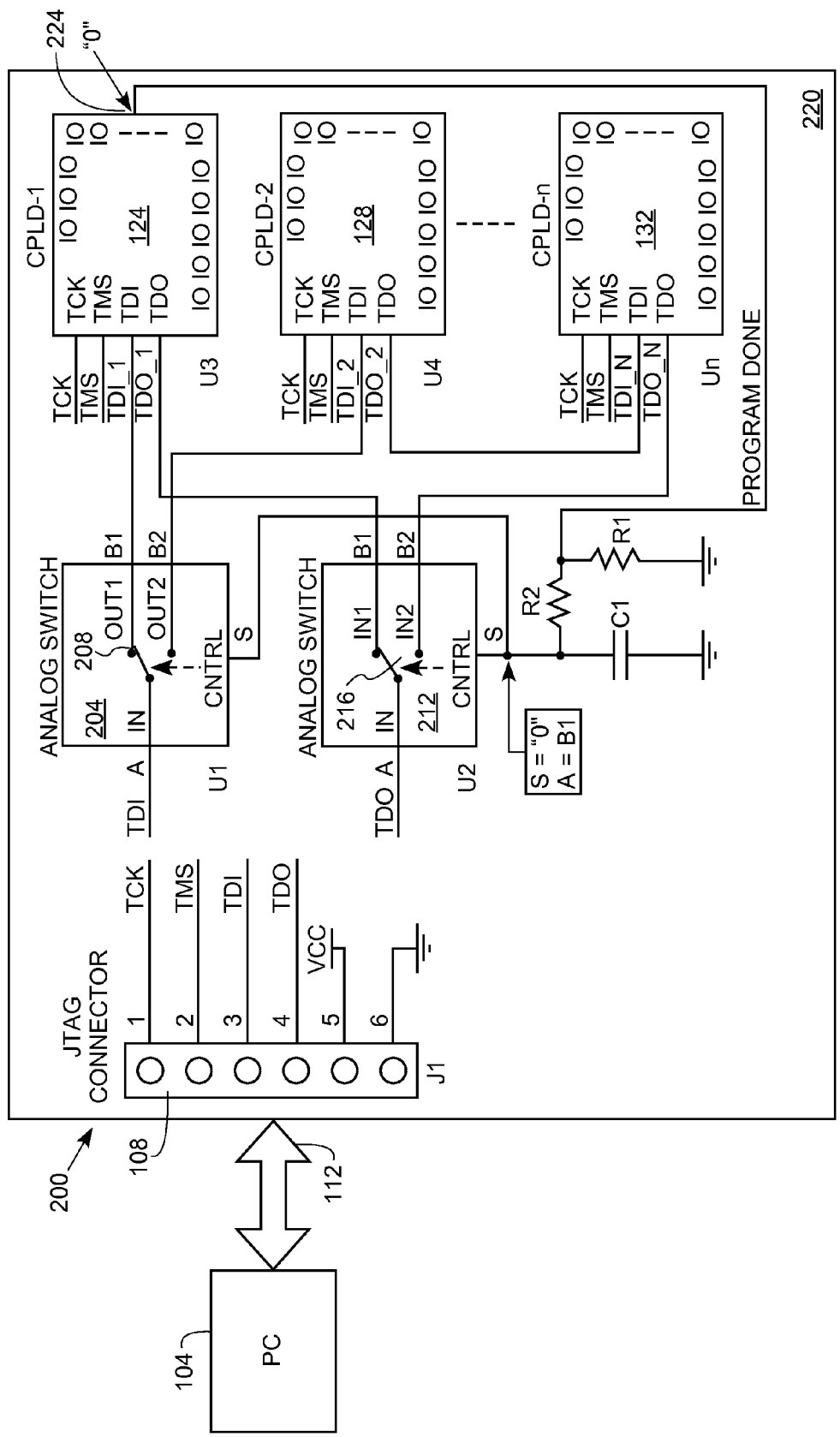
FIG. 2 is a schematic showing the first CPLD (safety CPLD) concatenated with several other CPLD components before programming.
Figure 3:
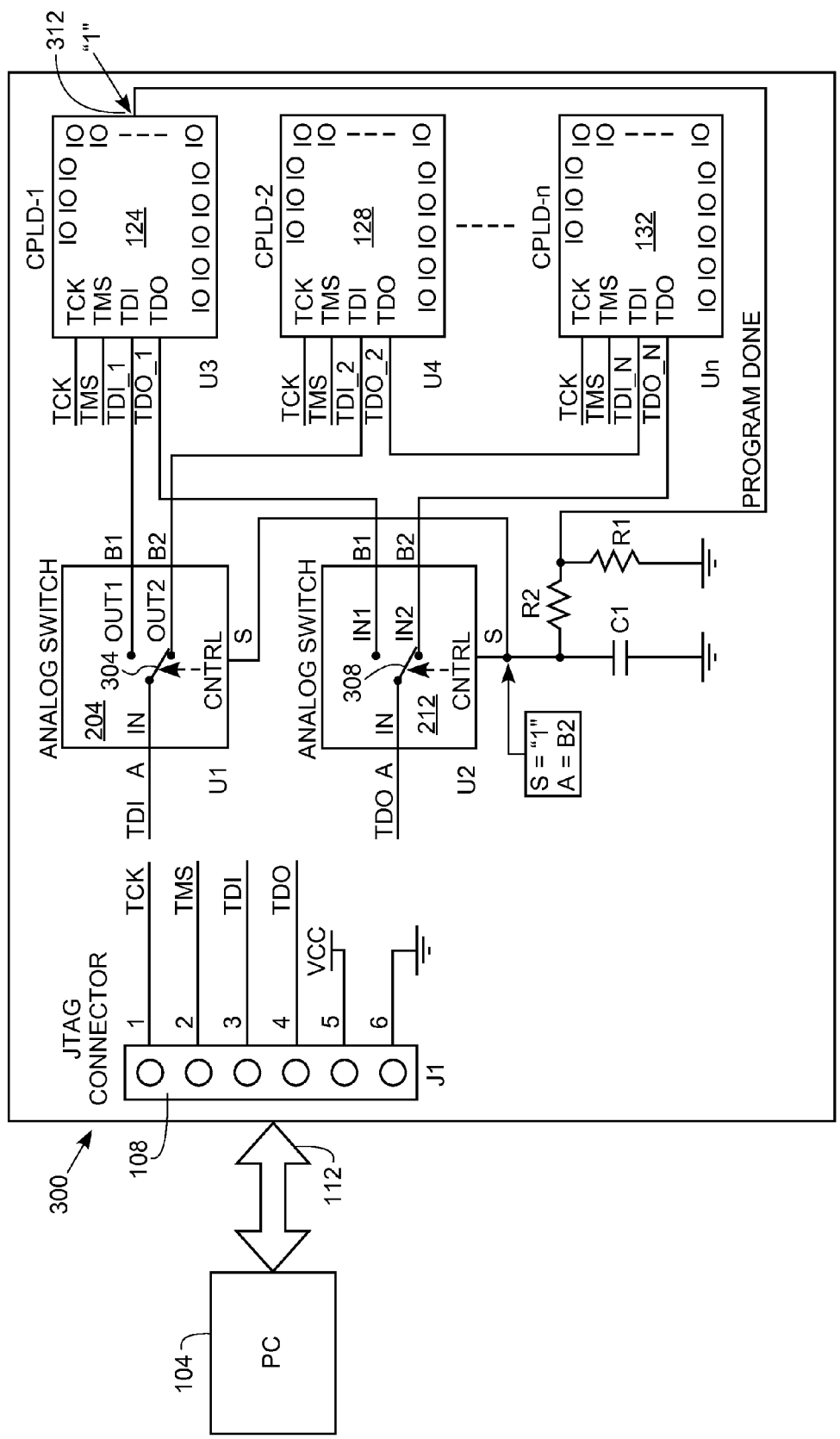
FIG. 3 is a schematic showing the first CPLD (safety CPLD) concatenated with several other CPLD components after programming.

FIG. 2 and FIG. 3 show an electronic board 200. Board 200 is formed with a similar configuration to the prior art shown with board 100 in FIG. 1. The difference between board 100 and board 200 is in that board 200 is equipped with electronic means adapted to isolate CPLD 124 from the other CPLD in CPLDs chain (128, 132).

The isolation of CPLD 124 which is the safety CPLD is achieved by addition of analog switches 204 and 212. Analog switch 204 switches line TDI between CPLD 124 and the chain of the other CPLDs (128, 132). Similarly analog switch 212 switches line TDO between CPLD 124 and the chain of the other CPLDs. The isolation of CPLD component 124 when residing in board 200 enables CPLD 124 to be limited to singular programming, thus prevents any further programming that may negatively affect safety conditions of the device.

The CPLD components (124, 128, 132) are not programmed at its original state. At the first power up the IO pins are in a logical tri state. FIG. 2 shows a pull down resistor R1 which sets IO pin into logical state "0" prior programming 224. At this state analog switch 204 connects input pin TDI to OUT1 via switch 208, whereas analog switch 212 connects output pin TDO to IN1 via switch 216. Resistor R2 and capacitor C1 act as delay circuit. This setup isolates CPLD 124 for programming since TDI and TDO are connected only to CPLD 124 via analog switches 204 and 212. Program mode (program done) is represented by line 220.

The next step is to program the safety CPLD 124. Controller 104 programs CPLD 124 via JTAG interface 108. FIG. 3 shows board 300 after programming of CPLD 124 is completed, IO pin of CPLD 124 is set to logical "1" state 312. At this stage analog switch 204 will set switch to state 304 thus connecting TDI line to OUT2, whereas switch 212 will set to state 308 to connect TDO to IN2. This state will be kept forever; CPLD 124 is programmed and is disconnected from the chain of all other CPLDs (128, 132).

At this stage, any subsequent power up of the board at stage 300 will enable programming of any one of the CPLDs (128, 132) which are connected in the chain, thus enabling programming of those CPLDs for maintenance reasons in the field. CPLD 124 will not be accessible for programming at stage 300 in the field, thus ensuring that the safety CPLD is not mutative any more.

The invention has been described in detail with particular reference to certain preferred embodiments thereof, but it will be understood that variations and modifications can be effected within the scope of the invention.

PARTS LIST

| | |
|---|---|
| 100 | electronic board |
| 104 | controller |
| 108 | JTAG interface |
| 112 | interface lines |
| 124 | first CPLD |
| 128 | second CPLD |
| 132 | last CPLD in chain |
| 200 | board before programming of CPLD 124 |
| 204 | IN lines analog switch |
| 208 | switch 204 at OUT1 state: CPLD 124 before programming |
| 212 | OUT lines analog switch |
| 216 | switch 212 at IN1 state: CPLD 124 before programming |
| 220 | program mode line (program done) |
| 224 | IO pin at CPLD 124 before programming state |
| 300 | board after programming of CPLD 124 |
| 304 | switch 204 at OUT2 state: CPLD 124 after programming |
| 308 | switch 212 at IN2 state: CPLD 124 after programming |
| 312 | IO pin at CPLD 124 after programming state |
| TDI | input pin |
| TDO | output pin |
| TMS | timing pin |
| TCK | clock pin |

The invention claimed is:

1. A method for a singular programming a programmable component in an electronic circuit comprising:
    providing a plurality of programmable components connected between each other in an electronic chain arrangement;
    providing an interface adapted to connect said programmable components to an external controller wherein said controller is adapted to program said programmable components;
    isolating a safety component by setting an output pin in said safety component to logical state zero at first power up of said electronic circuit and wherein said logical state zero causes input data line and output data line from said interface to be connected just to said safety component;
    programming said safety component; and
    setting said output pin in said safety component to logical state one wherein said logical state one causes input data line and output data line from said interface to disconnect from said safety component and connect to said electronic chain of said plurality of programmable components excluding said safety component.

2. The method according to claim 1 wherein said interface is a joint test action group (JTAG) interface.

3. The method according to claim 1 wherein said programmable component is a complex programmable logic device (CPLD) component.

* * * * *